(12) United States Patent
Fischer

(10) Patent No.: US 8,279,074 B2
(45) Date of Patent: Oct. 2, 2012

(54) BATTERY MONITORING SYSTEM, SUCH AS FOR USE IN MONITORING CELL SITE POWER SYSTEMS

(75) Inventor: Steve Fischer, Lutz, FL (US)

(73) Assignee: T-Mobile USA, Inc., Bellevue, WA (US)

( * ) Notice: Subject to any disclaimer, the term of this patent is extended or adjusted under 35 U.S.C. 154(b) by 891 days.

(21) Appl. No.: 12/365,165

(22) Filed: Feb. 3, 2009

(65) Prior Publication Data
US 2010/0007506 A1    Jan. 14, 2010

Related U.S. Application Data

(63) Continuation-in-part of application No. 12/170,675, filed on Jul. 10, 2008.

(51) Int. Cl.
G08B 21/00 (2006.01)
H02J 7/00 (2006.01)
G01N 27/416 (2006.01)
G01R 31/36 (2006.01)

(52) U.S. Cl. ............... 340/636.1; 340/636.15; 340/660; 340/662; 320/130; 320/136; 324/428; 702/63

(58) Field of Classification Search ............... 340/636.1
See application file for complete search history.

(56) References Cited

U.S. PATENT DOCUMENTS

| | | | |
|---|---|---|---|
| 5,099,694 A * | 3/1992 | Sumio et al. | 73/654 |
| 5,185,684 A | 2/1993 | Beihoff et al. | |
| 5,894,407 A | 4/1999 | Aakalu et al. | |
| 5,934,079 A | 8/1999 | Han et al. | |
| 5,939,990 A * | 8/1999 | Ahn | 340/636.15 |
| 6,188,591 B1 | 2/2001 | Ruter et al. | |
| 6,223,037 B1 | 4/2001 | Parkkila | |
| 6,304,059 B1 | 10/2001 | Chalasani et al. | |
| 6,343,498 B1 | 2/2002 | Oba et al. | |
| 6,533,031 B1 | 3/2003 | Garcia et al. | |
| 6,577,478 B2 * | 6/2003 | Kim et al. | 361/42 |
| 6,639,769 B2 | 10/2003 | Neiger et al. | |
| 6,889,752 B2 | 5/2005 | Stoller | |
| 6,929,785 B2 | 8/2005 | Grieve et al. | |
| 7,970,585 B2 * | 6/2011 | Van Sloun et al. | 702/188 |
| 2004/0218567 A1 | 11/2004 | Budka et al. | |

(Continued)

FOREIGN PATENT DOCUMENTS

EP    1296464    10/2007

(Continued)

OTHER PUBLICATIONS

"Battery Charging," IdaTech Advance Fuel Cell Solutions, Feb. 25, 2009, 1 page.

(Continued)

*Primary Examiner* — Jennifer Mehmood
*Assistant Examiner* — John Mortell

(57) ABSTRACT

A system, apparatus, and method for generating backup power in a wireless communications system such as a wireless communications service base station includes a communications interface, a primary power interface, a generator, rectifiers, and a battery circuit. During normal operation, the communications interface is powered from the primary power interface. During a power outage, the communications interface is powered from either the generator or the battery circuit. A battery circuit monitoring circuit detects and/or predicts loose, corroded, intermittent, high resistance, arcing, open, shorted, and/or the like connections.

20 Claims, 11 Drawing Sheets

U.S. PATENT DOCUMENTS

| | | |
|---|---|---|
| 2005/0213527 A1 | 9/2005 | Xie |
| 2006/0182262 A1 | 8/2006 | Goldman et al. |
| 2007/0086132 A1 | 4/2007 | Ravera et al. |
| 2007/0110335 A1 | 5/2007 | Taylor et al. |
| 2007/0119638 A1 | 5/2007 | Grieve |
| 2007/0253028 A1 | 11/2007 | Widdowson |
| 2008/0013528 A1 | 1/2008 | Miller et al. |
| 2008/0064361 A1 | 3/2008 | Bjork et al. |
| 2008/0205694 A1 | 8/2008 | Sagoo et al. |
| 2010/0009694 A1 | 1/2010 | Fischer |
| 2010/0009724 A1 | 1/2010 | Fischer |
| 2011/0021186 A1 | 1/2011 | Fischer |

FOREIGN PATENT DOCUMENTS

| | | | |
|---|---|---|---|
| WO | WO-97/34432 A1 | 9/1997 | |

OTHER PUBLICATIONS

"ElectraGen™ XTi Integrated Fuel Cell System," IdaTech LLC., Copyright 2002-2007, 2 pages.

"Fuel Cells," IdaTech Advanced Fuel Cell Solutions, Feb. 25, 2009, 1 page.

"Fuel Processing," IdaTech Advanced Fuel Cell Solutions, Feb. 25, 2009, 1 page.

"Glossary," IdaTech Advance Fuel Cell Solutions, Feb. 25, 2009, 2 pages.

"iGen™ Fuel Cell Power Supply," IdaTech LLC., Copyright 2002-2007, 2 pages.

"Methanol," IdaTech Advanced Fuel Cell Solutions, Feb. 25, 2009, 2 pages.

"Proton exchange membrane fuel cell," Wikipedia, Feb. 25, 2009, 6 pages.

"System Design," Hunter International, Aug. 22, 2008, 2 pages.

"Types of Fuel Cell Technology," IdaTech Advanced Fuel Cell Solutions, Feb. 25, 2009, 1 page.

International Search Report and Written Opinion for PCT/US2010/043267; Filed on Jul. 26, 2010; Applicant: T-Mobile USA, Inc.; Date of Mailing Apr. 5, 2011; 9 pages.

International Search Report and Written Opinion for PCT/US2010/043263; Filed on Jul. 26, 2010; Applicant: T-Mobile USA, Inc.; Date of Mailing Apr. 15, 2011; 8 pages.

International Search Report and Written Opinion for PCT/US2009/050313; Applicant: T-Mobile USA, Inc.; Date of Mailing: Sep. 3, 2009, 14 pages.

International Search Report and Written Opinion for PCT/US2009/050315; Applicant: T-Mobile USA, Inc.; Date of Mailing: Sep. 10, 2009, 12 pages.

Generator Start Control Module—Mini (2 Wire to 3 Wire), Atkinson Electronics, Inc., REV Sep. 2005, 8 pages.

Ericsson Site Solution, Diesel and Battery in Hybrid Operation, Ericsson, Mar. 17, 2008, 13 pages.

\* cited by examiner

BATTERY MONITORING SYSTEM, SUCH AS FOR USE IN MONITORING CELL SITE POWER SYSTEMS

CROSS-REFERENCE TO RELATED APPLICATIONS

This application is a continuation-in-part of U.S. application Ser. No. 12/170,675, entitled "CELL SITE POWER GENERATION," filed on Jul. 10, 2008, which is hereby incorporated by reference and the benefit of which is claimed under 35 U.S.C. §120.

BACKGROUND

The popularity of commercial wireless communications services (e.g., wireless telephony, wireless network access, and wireless email) has substantially increased during recent years. In many cases, users, such as consumers, mobile workers, emergency response personnel, and/or the like, now utilize these services for both personal and business communications. Likewise, users are also increasingly relying on these services. For example, some households forgo wired telephone service in favor of wireless telephone service, some government agencies rely on these services for both routine and emergency communications, and businesses rely on these services to communicate with customers and mobile workers. Correspondingly, the cost (both financial and nonfinancial) of outages is also increasing.

Typical commercial wireless communications service (CMRS) providers rely on remote facilities to facilitate the provision of services. For instance, CMRS providers rely on base stations (e.g., cell sites, radio repeaters, wireless to back-haul interfaces, etc.) to facilitate some communications services. If a base station experiences a loss of commercially-provided electrical power, users near the base station may experience a service outage. Power outages are an example of a common cause for base station failures. For example, natural disasters, rolling brownouts, accidents, and/or the like may result in power outages. While most base stations include some form of backup power (e.g., generators and/or batteries), these forms of backup power may not provide sufficient power during lengthy power outages and may require servicing, monitoring, and on-site maintenance. During lengthy power outages, use of commercial wireless communications services may increase due to users' needs and/or desires. Further, pending regulations may require commercial wireless communications service providers to provide base stations with at least seven days of backup power.

DETAILED DESCRIPTION

The following description provides specific details for a thorough understanding of, and enabling description for, various embodiments of the technology. One skilled in the art will understand that the technology may be practiced without many of these details. In some instances, well-known structures and functions have not been shown or described in detail to avoid unnecessarily obscuring the description of the embodiments of the technology. It is intended that the terminology used in the description presented below be interpreted in its broadest reasonable manner, even though it is being used in conjunction with a detailed description of certain embodiments of the technology. Although certain terms may be emphasized below, any terminology intended to be interpreted in any restricted manner will be overtly and specifically defined as such in this Detailed Description section.

Suitable System

Figure 1:
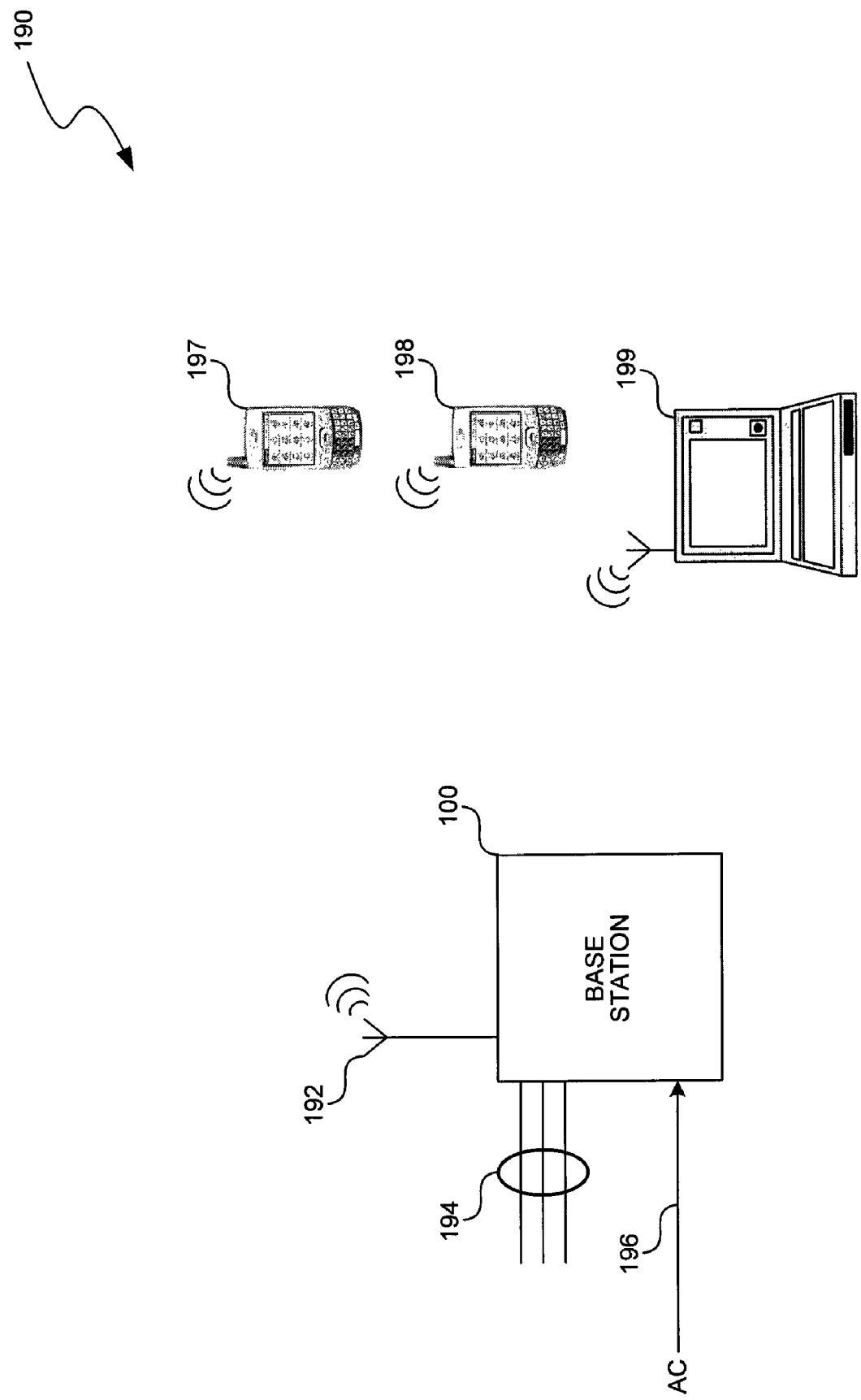
FIG. 1 is a block diagram of an embodiment of an environment for practicing the invention.

FIG. 1 is a block diagram of environment 190 in which the invention may be practiced. As shown, environment 190 includes base station 100 and wireless devices 197-199. Base station 190 includes antenna 192 and is coupled to back-haul 194 and to primary power source AC over line 196. Base station 190 and wireless devices 197-199 are configured to wirelessly communicate with each other.

Base station 100 may include virtually any device for facilitating wireless network access. For example, base station 100 may be a wireless telephony base station, a wireless network access base station, a wireless email base station, and/or the like. In one embodiment, base station 100 is operated by a mobile telephony service provider. Generally, base station 100 is configured to provide a network interface for wireless devices 197-199 by providing an interface (via antenna 192) between wireless devices 197-199 and back-haul 194. Base station 100 and wireless devices 197-199 may communicate using any wireless protocol or standard. These include, for example, Global System for Mobile Communications (GSM), Time Division Multiple Access (TDMA), Code Division Multiple Access (CDMA), Orthogonal Frequency Division Multiple Access (OFDM), General Packet Radio Service (GPRS), Enhanced Data GSM Environment (EDGE), Advanced Mobile Phone System (AMPS), Worldwide Interoperability for Microwave Access (WiMAX), Universal Mobile Telecommunications System (UMTS), Evolution-Data Optimized (EVDO), Long Term Evolution (LTE), Ultra Mobile Broadband (UMB), and/or the like.

Back-haul 194 may be any connection that provides a network interface for base station 100. For example, back-haul 194 may include one or more T-1 connections, T-3 connections, OC-3 connections, frame relay connections, Asynchronous Transfer Mode (ATM) connections, microwave connections, Ethernet connections, and/or the like. In addition, back-haul 194 may provide an interface to a telephone switch (e.g., to a 5ESS switch or a Private Branch Exchange switch) to a data network (e.g., to a router or network switch), and/or the like.

Base station 100 is also powered from primary power source AC over line 196. Primary power source AC may be provided by virtually any power source. For example, it may be provided as alternating current (AC) power by a public utility, from solar power, from a turbine, from a fuel cell, and/or the like. However, direct current (DC) power may also be provided by primary power source AC. At times, however, primary power source AC may provide insufficient power for base station 100. As discussed below, base station 100 also includes backup power sources.

Wireless devices 197-199 may include virtually any devices for communicating over a wireless network. For example, wireless devices 197-199 may include mobile telephones (e.g., cellular telephones, GSM telephones, TDMA telephones, LTE telephones, etc.), wireless data devices (e.g., Personal Digital Assistants (PDAs), computers, pagers, etc.), and/or the like.

One skilled in the art will appreciate that although illustrated in the context of a wireless telecommunications environment, the invention may be practiced in any environment in which backup power serves a commercial, public, or private operation or system reliant upon electrical power.

Figure 2:
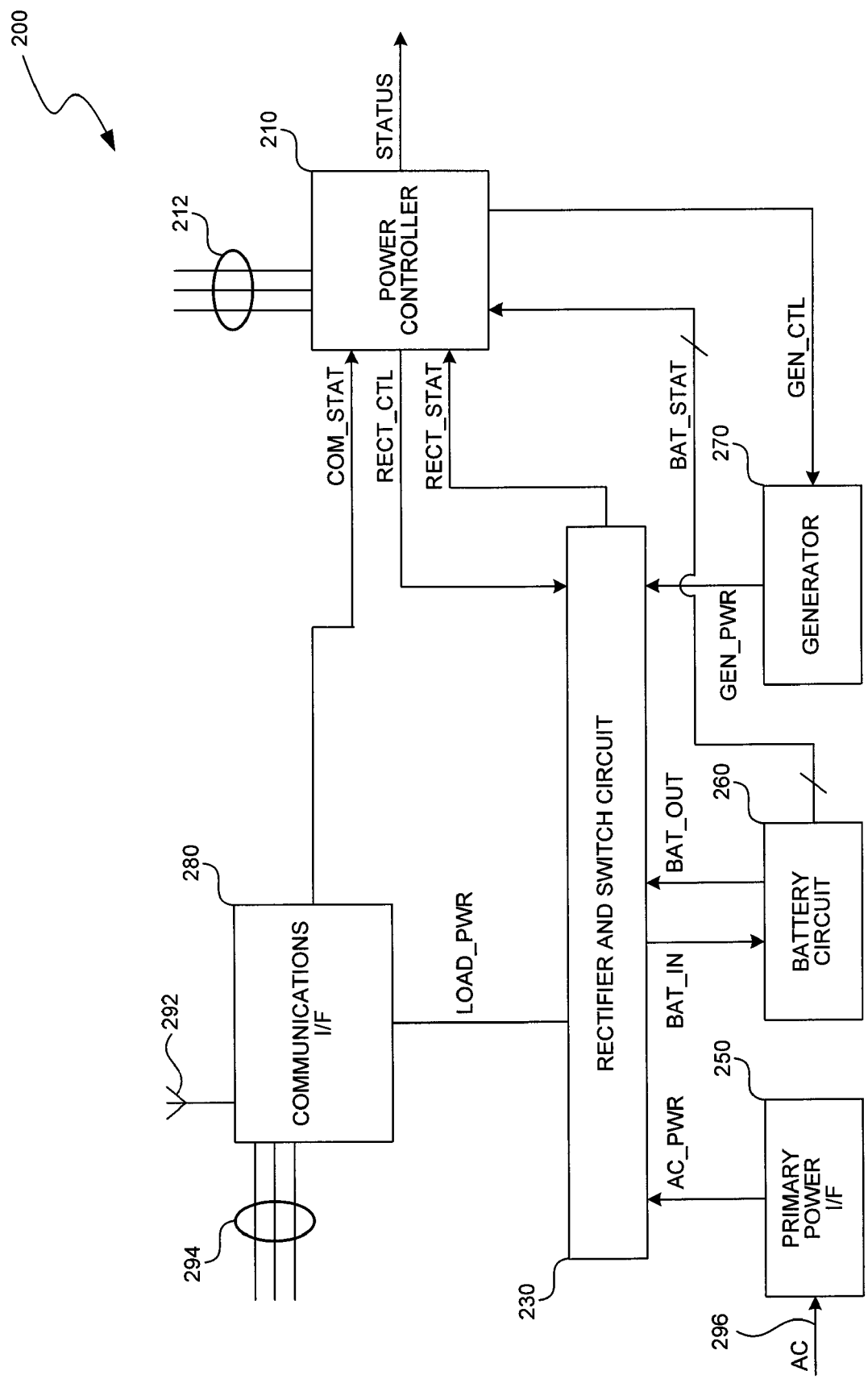
FIG. 2 is a block diagram of a base station in accordance with an embodiment of the invention.

FIG. 2 is a block diagram of base station 200. Base station 200 includes power controller 210, rectifier and switch circuit 230, primary power interface 250, battery circuit 260, generator 270, and communications interface 280. Base station 200 may be employed as an embodiment of base station 100 of FIG. 1.

Power controller 210 is configured to control the power systems of base station 200. As illustrated, power controller 210 is configured to receive or provide control signals 212 and status signals COM_STAT, RECT_STAT, and BAT_STAT, and to provide output/control signals RECT_CTL, GEN_CTL, and STATUS, as discussed below.

In one embodiment, power controller 210 is configured to selectively enable and disable generator 270 and to control the operation of rectifier and switch circuit 230 based, at least in part, on the various status and control signal inputs. The operation of power controller 210 is discussed in further detail with regards to FIG. 3.

Rectifier and switch circuit 230 may include switching devices of any type (e.g., power field-effect-transistors, power insulated gate bi-polar transistors, relays, etc.) that are configured to selectively switch (e.g., route) power from either primary power interface 250, battery circuit 260, or generator 270 to communications interface 280. Rectifier and switch circuit 230 may also be configured to selectively switch power from either primary power interface 250 or generator 270 to battery circuit 260 for providing a charging current. The switching between communications interface 280, primary power interface 250, battery circuit 260, and generator 270 may be controlled via control signal RECT_CTL from power controller 210.

In addition, rectifier and switch circuit 230 may also include multiple rectifiers that are each configured to rectify power either from primary power interface 250 or from generator 270 before providing it either to communications interface 280 or to battery circuit 260. Each of the rectifiers in rectifier and switch circuit 230 may be controlled via control signal RECT_CTL from power controller 210.

For some common rectifiers, rectification efficiency increases when the rectifier is run at higher loads. However, continuous operation of rectifiers at higher loads may increase operating temperatures and may lead to premature failure of the rectifiers. Accordingly, when base station 200 is powered from primary power source AC, communications interface 280's power draw may be balanced across each of the rectifiers of rectifier and switch circuit 230 to reduce the load on each rectifier. However, during periods of primary power source reduced availability, the power drawn by communications interface 280 may be balanced across fewer rectifiers such that efficiency of each operating rectifier is increased.

Rectifier and switch circuit 230 may also be configured to provide status signal RECT_STAT to power controller 210 to, for example, indicate the status of rectifiers, the status of switches, the status of primary power source AC, the status of generator 270's output, failure conditions (e.g., failure of particular rectifiers, failure of particular switches, excessive current draw from communications interface 280, out of range input voltages, etc.), and/or the like. Status signal RECT_STAT may be provided to power controller 210 to enable power controller 210 to adjust the operation of rectifier and switch circuit 230 or generator 270 based on these and other conditions.

Primary power interface 250 is configured to couple primary power source AC to rectifier and switch circuit 230. Primary power interface 250 may include a circuit breaker, line filter, surge protector, power meter, and/or the like. However, in one embodiment, primary power interface 250 may simply be a wire segment connecting primary power source AC to rectifier and switch circuit 230.

Battery circuit 260 is configured to store power that is provided by primary power source AC or by generator 270. Battery circuit 260 may include any number of batteries, or other electrical energy storage devices (e.g., ultracapacitors, supercapacitors, other capacitors, inductors, etc.), arranged in any combination of series configurations, parallel configurations, and/or series and parallel configurations. In one embodiment, battery circuit 260 includes multiple strings of serially connected absorbed glass mat lead-acid batteries. However, any suitable type of battery or other electrical energy storage device may be employed. Further, battery circuit 260 is configured to provide status signal BAT_STAT to power controller 210. For example, status signal BAT_STAT may be employed to indicate the output voltage of battery circuit 260, a voltage of each individual battery, and/or the like. Also, status signal BAT_STAT may include multiple signals and be provided on one or more signal lines.

Power controller 210 may be configured to determine a failure condition or approximate a charge percentage for battery circuit 260, and/or the like, from status signal BAT_STAT. While battery circuit 260 is illustrated as being coupled to rectifier and switch circuit 230 by signals BAT_IN and BAT_OUT, in other embodiments, signals BAT_IN and BAT_OUT may be a single signal.

Generator 270 is configured to generate power under the control of power controller 210 for powering communications interface 280 and for charging battery circuit 260. Generator 270 is further configured to enable and disable power generation based on control signal GEN_CTL. The output of generator 270 is provided to rectifier and switch circuit 230 via signal GEN_PWR.

With certain generators, fuel consumption is primarily a function of run-time. For these generators, the increase in fuel consumption is relatively insignificant when the load current is increased. Accordingly, the total power produced from a given amount of fuel is greater when operating a generator at high loads for short durations as compared to continuously operating a generator at lower loads. In addition, operating a higher output wattage generator may produce a greater the total power output from a given amount of fuel than a lower output wattage generator.

Thus, to conserve fuel, generator 270 may be enabled when the charge on battery circuit 260 is relatively low and disabled when the charge is relatively high. While running, generator 270 may be employed to power communications interface 280 and to charge battery circuit 260. While generator 270 is stopped, communications interface 280 may be powered from battery circuit 260. In this way, generator 270 produces more power for a given amount of fuel. In one embodiment, generator 270 is enabled when the voltage of battery circuit 260 represents that less than a 20 percent charge remains on battery circuit 260 and is disabled when the voltage represents that battery circuit 260 has an 82 percent charge. Although, any other suitable percentages, voltages, charge conditions, and/or the like may be employed. Thus, power controller 210 controls generator 270 to operate intermittently, with high load, when the charge on battery circuit 260 is below a threshold; otherwise, battery circuit 260 provides backup power to communications interface 280. Also, generator 270 may be selected such that while powering communications interface 280 and charging battery circuit 260 near a maximum charge rate (e.g., a manufacturer specified maximum rate, a manufacturer specified recommended rate, an operator specified rate, etc.) generator 270 operates at high load. This selection may be based on the DC load requirements of communications interface 280, the power available to charge battery circuit 260, the number of batteries in battery circuit 260, the ampere hour ratings of the batteries in battery circuit 260, expected efficiency, anticipated future power requirements, operating margins, and/or the like. In one embodiment, the maximum charge rate for battery circuit 260 is approximately twice the recommended discharge rate for battery circuit 260.

As one example, a 20 kilowatt water cooled Generac generator and a 370 ampere hour battery circuit may be employed to power a Nokia UltraSite communications interface having 15 to 18 radio units and an additional two rectifiers in the rectifier and switch circuit. In this example, while powering the communications interface, approximately 80 amperes are available to charge and/or cool the battery circuit. Also, a charged battery circuit has approximately 220 ampere hours (after accounting for internal resistance and other losses) available to power communications interface 280 between charging cycles. Under normal circumstances, 220 ampere hours provides 5.5 to 7 hours of power to communications interface 280.

Such operation may increase the service life and decrease maintenance for both battery circuit 260 and generator 270. Likewise, such operation may increase the length of time that communications interface 280 may operate from backup power. In one embodiment, a 250 gallon propane tank may be sufficient to power communications interface 280 for 6 days with intermittent generator operation as compared to 3.5 days with continuous generator operation.

Generator 270 may include a gasoline generator, a diesel generator, a propane generator, a natural gas generator, a methanol generator, an ethanol generator, and/or the like. Moreover, generator 270 may be either air-cooled or liquid-cooled.

Communications interface 280 is configured to interface (via antenna 292) wireless devices to back-haul 294. Communications interface 280 typically includes both digital and radio frequency (RF) electronics. In one embodiment, communications interface 280 includes a RF transceiver and digital control circuitry. However, other components may also be associated with a transceiver and/or other circuits. Communications interface 280 is powered from rectifier and switch circuit 230 via line LOAD_PWR and is configured to provide status signal COM_STAT to indicate an operational status such as failure of back-haul 294, the number of wireless devices associated with base station 200, power consumption data, and/or the like.

Power Controller Examples

Figure 3:
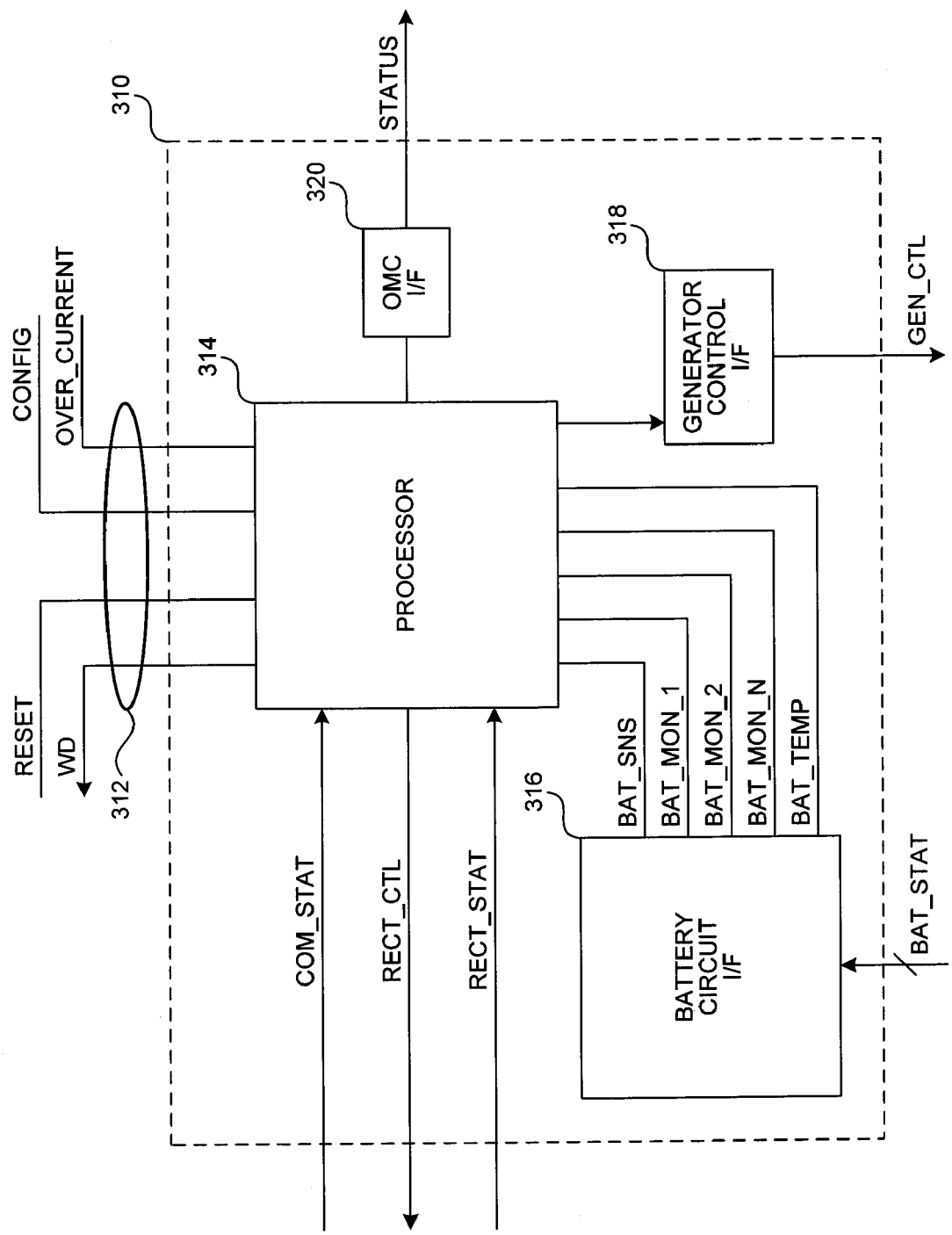
FIG. 3 is a block diagram of a power controller usable in the base station of FIG. 2 in accordance with an embodiment of the invention.

FIG. 3 is a block diagram of power controller 310. Power controller 310 includes processor 314, battery circuit interface 316, generator control interface 318, and operation, management, and control (OMC) interface 320. Power controller 310 may be employed as an embodiment of power controller 210 of FIG. 2.

As illustrated, processor 314 is configured to control the operations of the rectifier and switch circuit (e.g., via control signal RECT_CTL) and the generator (e.g., via control signal GEN_CTL) and to provide a status signal to a remote system (e.g., STATUS). In one embodiment, processor 314 is configured to selectively enable and disable the generator based, at least in part, on the primary power source status and a battery circuit status. For example, the generator may be enabled when there is reduced availability of the primary power source and the battery circuit voltage falls below a threshold value. Likewise, the generator may be disabled when the primary power source provides sufficient power, when the battery circuit voltage is above another threshold value, when there is a failure of the battery circuit, when an over-current condition is detected, when a battery circuit temperature is above a threshold value, when there is a failure in the rectifier and switch circuit, when processor 314 is in reset, and/or the like.

In one embodiment, processor 314 detects a failure of the battery circuit based on a rate of change of the battery circuit output voltage or of the voltages of the individual batteries of the battery circuit.

To determine these and other conditions, processor 314 receives various status signals as illustrated in FIG. 3. For example, signals COM_STAT and RECT_STAT may be employed to respectively represent the status of the communications interface and of the rectifier and switch circuit. Likewise, signal BAT_SNS may be employed to represent the output voltage of the battery circuit, signals BAT_MON_1 to BAT_MON_N may be employed to represent the voltage across the individual batteries of the battery circuit, and signal BAT_TEMP may be employed to represent a temperature of the battery circuit. Also, signal RESET may be employed to reset and/or hold processor 314 in reset. Finally, control signal OVER_CURRENT may be employed to represent an over-current condition of the battery circuit, of the rectifier and switch circuit, of the generator, and/or the like. Likewise, processor 314 may be configured to control the rectifier and switch circuit based, at least in part, on the availability status of the primary power source, as discussed above.

As illustrated, processor 314 is also configured to provide watchdog signal WD to a watchdog circuit (not shown). The watchdog circuit may be arranged to reset the processor via the RESET signal if, for example, the watchdog signal WD remains unchanged for a predefined duration. In other embodiments, internal watchdog circuits, and/or the like, may also be employed.

Processor 314 is further configured to receive configuration signal CONFIG to represent a hardware configuration, to set various threshold levels, and/or the like. Any number of configuration signals may be provided. In one embodiment, configurations signals are employed to represent the number and/or types of rectifiers in the rectifier and switch circuit, the design voltage of the battery circuit, the type of generator, the number of battery strings in the battery circuit, and/or the like. For example, a configuration signal may be provided to indicate whether the generator is air-cooled so that an air-cooled generator may be run for a cooling off period prior to being disabled by processor 314 (e.g., to charge battery circuit 260 as a high load for an initial period and then later charge battery circuit 260 as a lower load while cooling off). As another example, a configuration signal may be provided to indicate the load capacity of the rectifiers so that processor 314 may more accurately determine the number of active rectifiers for providing efficient rectification. As yet another example, a configuration signal may be provided to indicate the design voltage of the battery circuit so that processor 314 may more accurately estimate the charge on the battery circuit from the battery circuit output voltage.

Configuration signal CONFIG may be provided from a switch (e.g., a DIP switch), from pull-up resistors, from pull-down resistors, from jumpers, and/or the like. Alternatively, similar configuration information may be read by processor 314 from a memory or be received from another processor.

Processor 314 may be a microprocessor, a microcontroller, a digital signal processor (DSP), and/or the like. However, in other embodiments, digital logic, analog logic, combinations of digital logic and analog logic, and/or the like may also be employed instead of a processor. For example, such embodiments may be implemented in a field-programmable gate array (FPGA), in an application-specific integrated circuit (ASIC), in other programmable logic devices (PLDs), and/or the like.

Battery circuit interface 316 is configured to interface processor 314 to a battery circuit. For example, battery circuit interface 316 receives signal BAT_STAT from the battery circuit and provides discrete signals to processor 314. For example, signal BAT_STAT may be a multiplexed signal or may be provided on multiple signal lines. In one embodiment, battery circuit interface 316 includes an array of analog to digital converters (ADCs) that are configured to digitize each of signals BAT_SNS, BAT_MON_1 to BAT_MON_N, and BAT_TEMP for processor 314. However, multiplexers, drivers, buffers, logic gates, analog circuits, and/or the like may also be suitably employed.

Generator control interface 318 is configured to interface processor 314 to a generator such as generator 270 of FIG. 2. In one embodiment, generator control interface 318 includes a relay, a level-shifter, a driver, a buffer, an inverter, logic gates, and/or the like that is configured to provide control signal GEN_CTL based, at least in part, on the output of processor 314. Also, generator control interface 318 and/or processor 314 may be configured such that a failure of either generator control interface 318 or processor 314 results in the generator being enabled. In this way, a failure of processor 314 and/or generator control interface 318 is less likely to cause a power interruption at the communications interface.

OMC interface 320 is configured to interface processor 314 to a remote system and to provide operational data regarding the base station and/or the base station power system to the remote system. OMC interface 320 may include drivers, buffers, inverters, logic gates, network interface units, multiplexers, and/or the like. Likewise, OMC interface 320 may be configured to multiplex the STATUS signal onto the back-haul or may provide the STATUS signal as a discrete signal.

Monitoring Circuit Examples

Figure 4A:
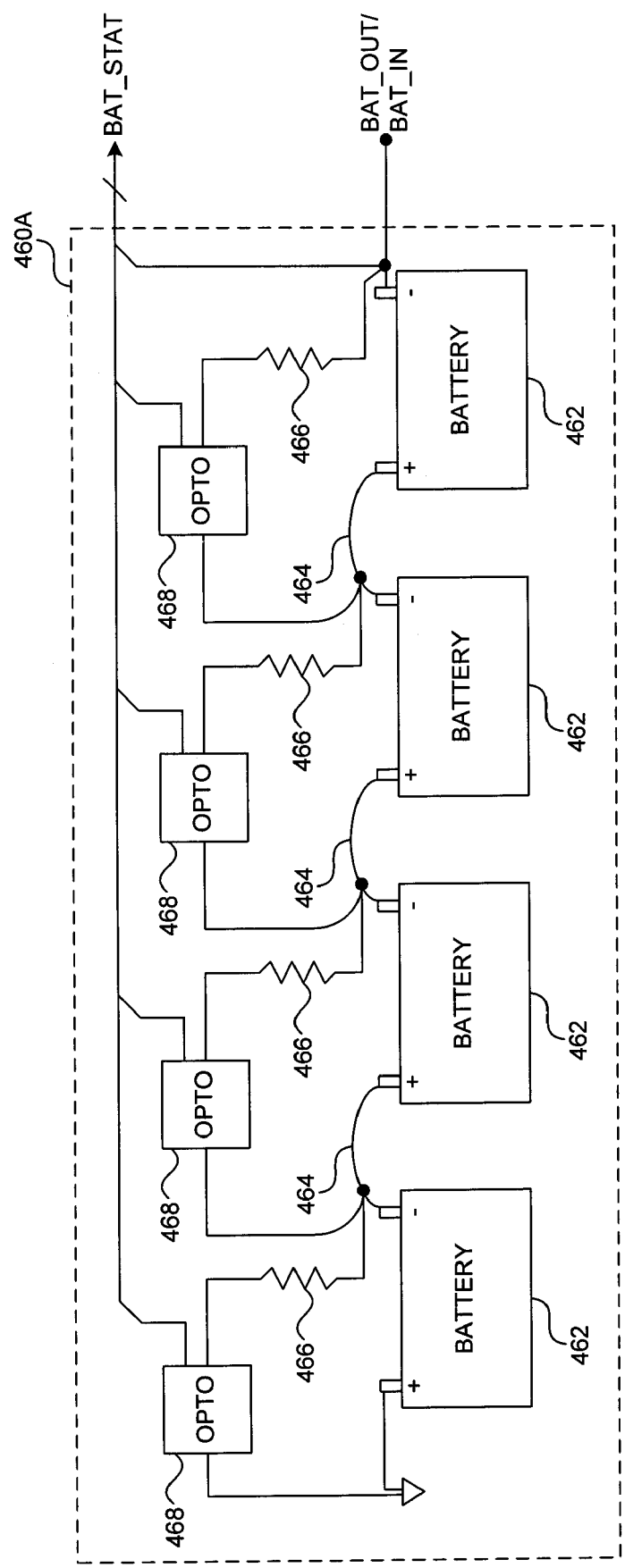
FIGS. 4A-4D are schematic diagrams of battery circuits usable in the base station of FIG. 2 in accordance with embodiments of the invention.

FIG. 4A is a schematic diagram of battery circuit 460A. Battery circuit 460A includes batteries 462, jumpers 464, current limiting resistors 466, and opto-isolator circuits 468. Battery circuit 460A may be employed as an embodiment of battery circuit 260 of FIG. 2. However, the battery circuits and opto-isolators of FIGS. 4A-4D and 5A-5B may also be employed in systems other than the base station or other communications systems of FIGS. 1-3. For example, the battery circuits and opto-isolators of FIGS. 4A-4D and 5A-5B may be employed in, or with, any system employing a backup or other battery circuit.

As illustrated, battery circuit 460A is configured as a negative 48-volt battery circuit having one string of serially connected absorbed glass mat lead-acid batteries. In this embodiment, batteries 462 are serially connected by jumpers 464 to form a single battery string. However, other battery circuits may be configured with any number of batteries and any number of battery strings and may provide any positive or negative output voltage. In addition, battery circuit 460A includes opto-isolator circuits 468 to sense the voltage across each of the batteries and associated jumpers. For example, opto-isolator circuits 468 may be configured and employed to monitor batteries 462, jumpers 464, and/or interconnections within battery circuit 460A. Current limiting resistors 466 are also included to limit the current to opto-isolator circuits 468. Current limiting resistors 466 may be of any suitable value and, for certain implementations, may be omitted.

By coupling opto-isolator circuits 468 across both the battery and associated jumper, the effects of loose, corroded, intermittent, high resistance, arcing, open, shorted, and/or the like connections may be included in the opto-isolator circuit output and may be detected and/or predicted by an attached power controller. For example, the power controller may monitor the collective outputs of opto-isolator circuits 468, the individual outputs of each opto-isolator circuit, differences in output between the opto-isolator circuits, and/or the like. Likewise, the power controller may monitor for AC, DC, non common-mode, common-mode, and/or the like components of battery outputs, e.g., via opto-isolator circuits 468.

As one example, opto-isolator circuits 468 may be monitored during all operations. In such a system, battery circuit 460A may also be periodically and/or occasionally discharged and recharged. For example, battery strings having faulty or loose interconnections may produce AC noise such as hissing, chirping, high-frequency whining, and/or the like. Such AC noise typically increases with load into, or out of, the battery string. Likewise, this AC noise may be particularly pronounced as the direction of current to/from the battery string changes (e.g., transition from discharging to charging or from charging to discharging). Accordingly, opto-isolator circuits 468 and a power controller may be employed to monitor the AC noise as the direction of current to/from the battery string changes.

Opto-isolator circuits 468, current limiting resistors 466, or both, may be physically coupled to the batteries at any point. However, as illustrated, the connections to the battery string are coupled to the jumpers relatively close to the associated battery; the connection to the grounded end of the battery string is coupled to ground at, or near, a grounding point; and the connection at the output end of the string is coupled to the output at, or near, the output. Connection in this manner may additionally enable monitoring of both the ground and output wiring and connections as well as monitoring of the connection of the jumpers to the batteries. In other embodiments, other isolated or non-isolated sense circuits may be employed instead of opto-isolator circuits 468. For example, ADCs, sense resistors, and/or the like may be employed.

Figure 4B:
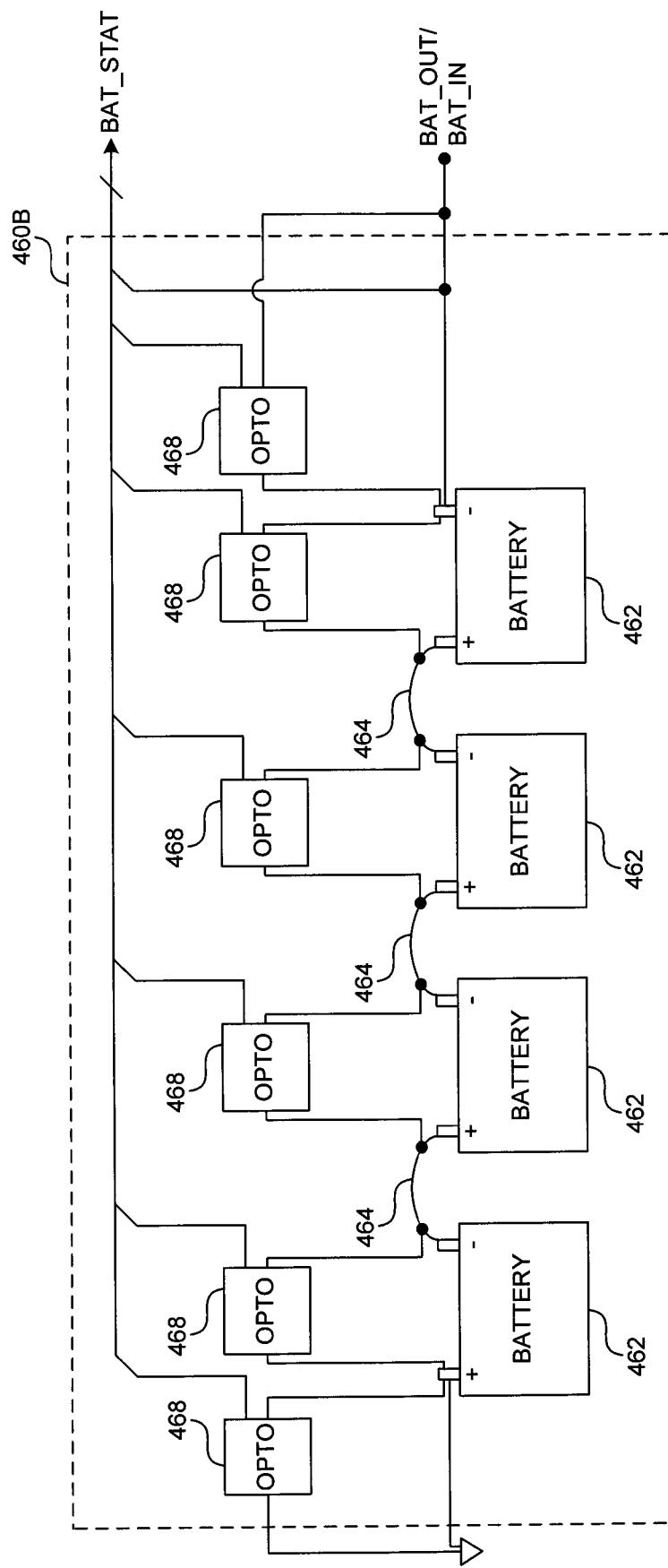
Figure 4C:
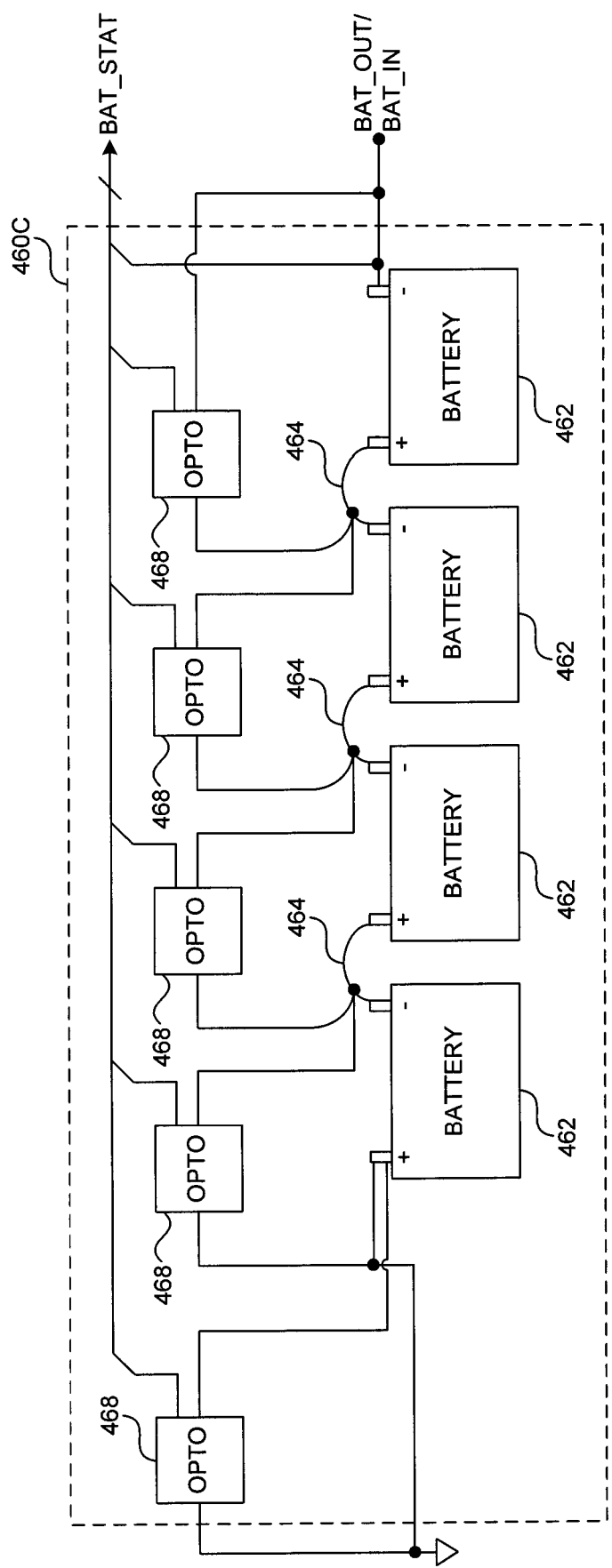
Figure 4D:
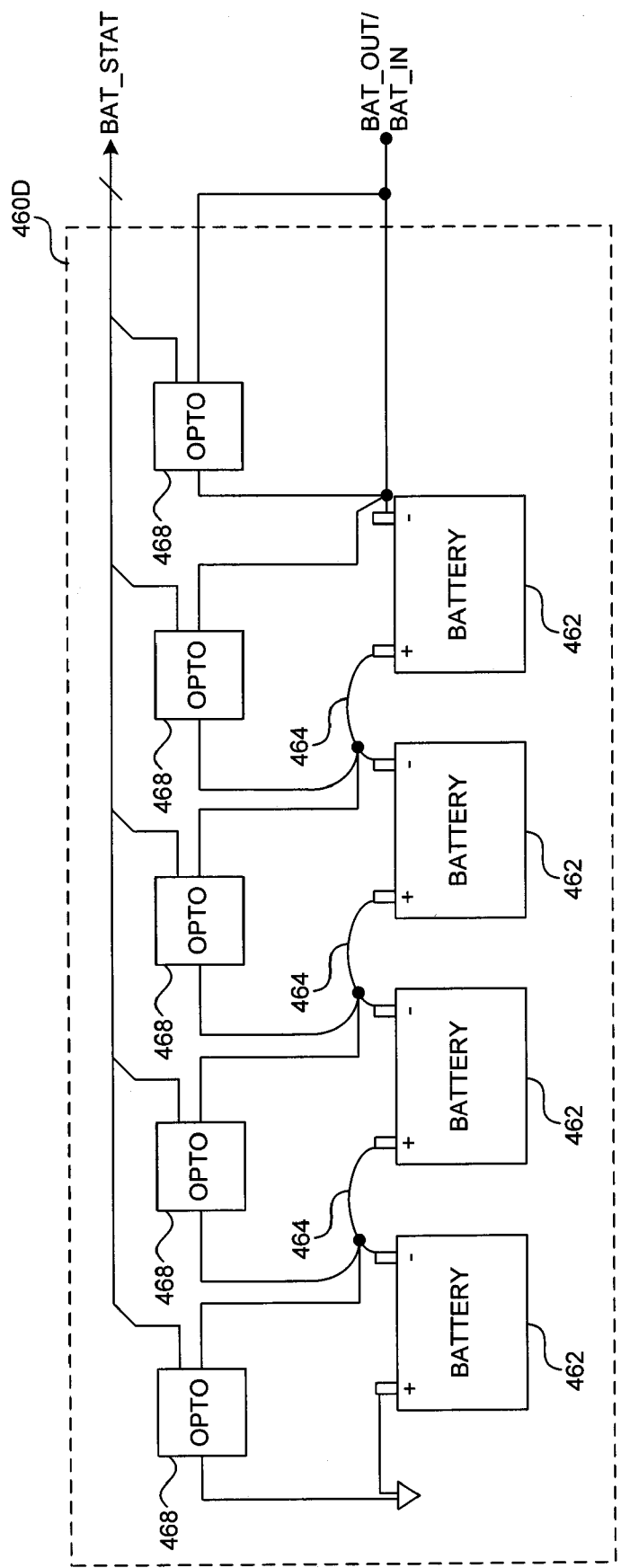

Various alternative examples are illustrated with respect to FIGS. 4B-4D. However, FIGS. 4B-4D are merely provided to illustrate some of the many ways that opto-isolator circuits may be coupled. The invention is not limited to the illustrated embodiments.

FIGS. 4B-4C are respective schematic diagrams of battery circuit 460B-460D which each includes batteries 462, jumpers 464, and opto-isolator circuits 468. Battery circuits 460B-460D may be employed as various embodiments of battery circuit 260 of FIG. 2. As shown, the opto-isolator circuits of battery circuit 460B are configured to monitor each of batteries 462, the ground connection, and the output connection.

Figure 5A:
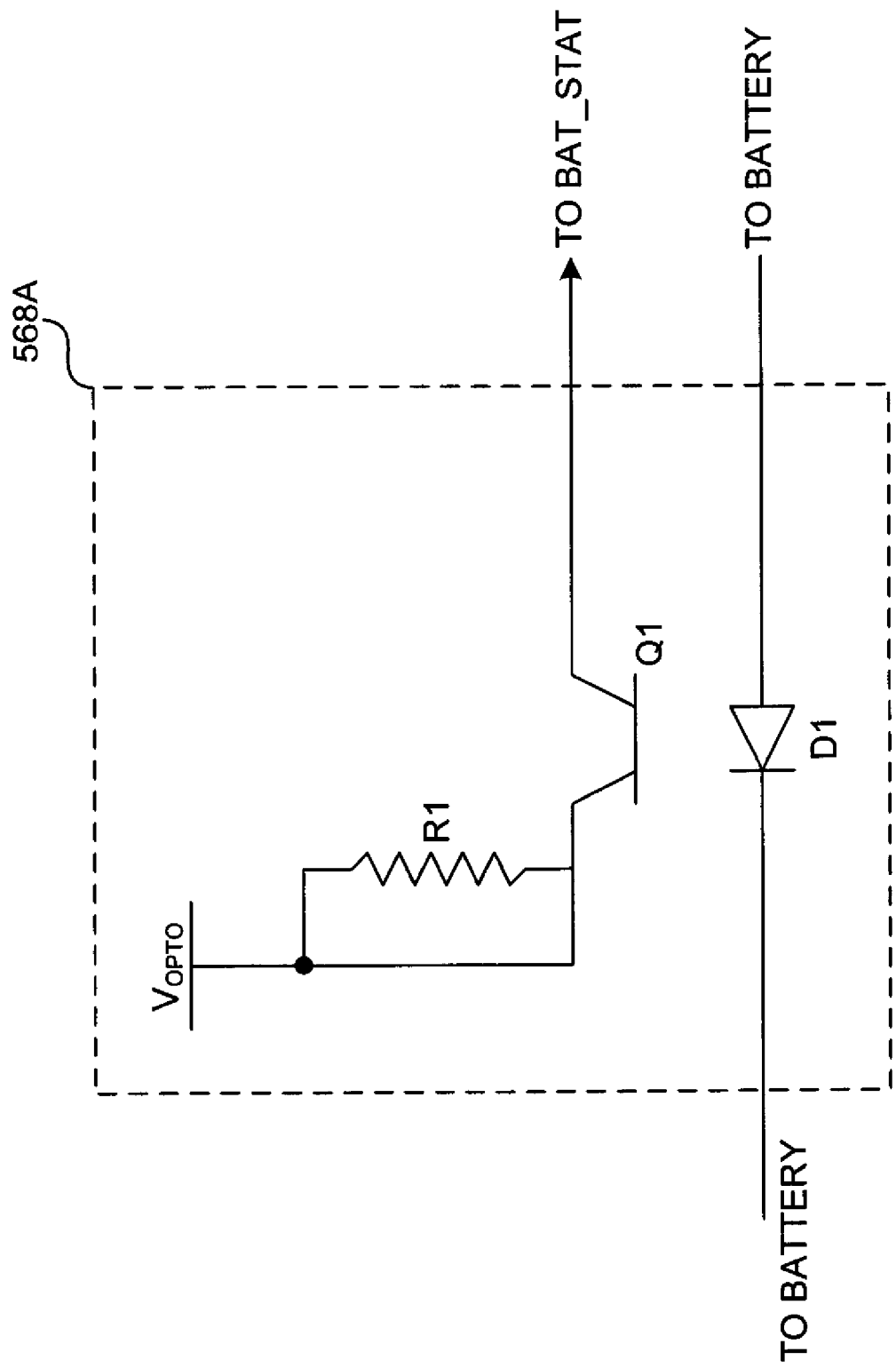
FIGS. 5A-5B are schematic diagrams of opto-isolators usable in the battery circuits of FIGS. 4A-4D in accordance with embodiments of the invention.

FIG. 5A is a schematic diagram of opto-isolator circuit 568A. Opto-isolator circuit 568A includes diode D1, transistor Q1, and resistor R1. Opto-isolator circuit 568A may be, for example, employed as embodiments of opto-isolator circuits 468 of FIG. 4A. However, opto-isolator circuit 568A may also be employed as embodiments of opto-isolator circuits 468 of FIGS. 4B-4D.

Opto-isolator circuit 568A is configured to provide an output signal that is based on the voltage applied across diode D1. In operation, the voltage across diode D1 causes current flow through diode D1 and causes diode D1 to provide an emitted light with an intensity that is related to the magnitude of the current flow. The emitted light is received by transistor Q1 to provide an output signal. Resistor R1 biases transistor Q1 and may be of any suitable value.

Figure 5B:
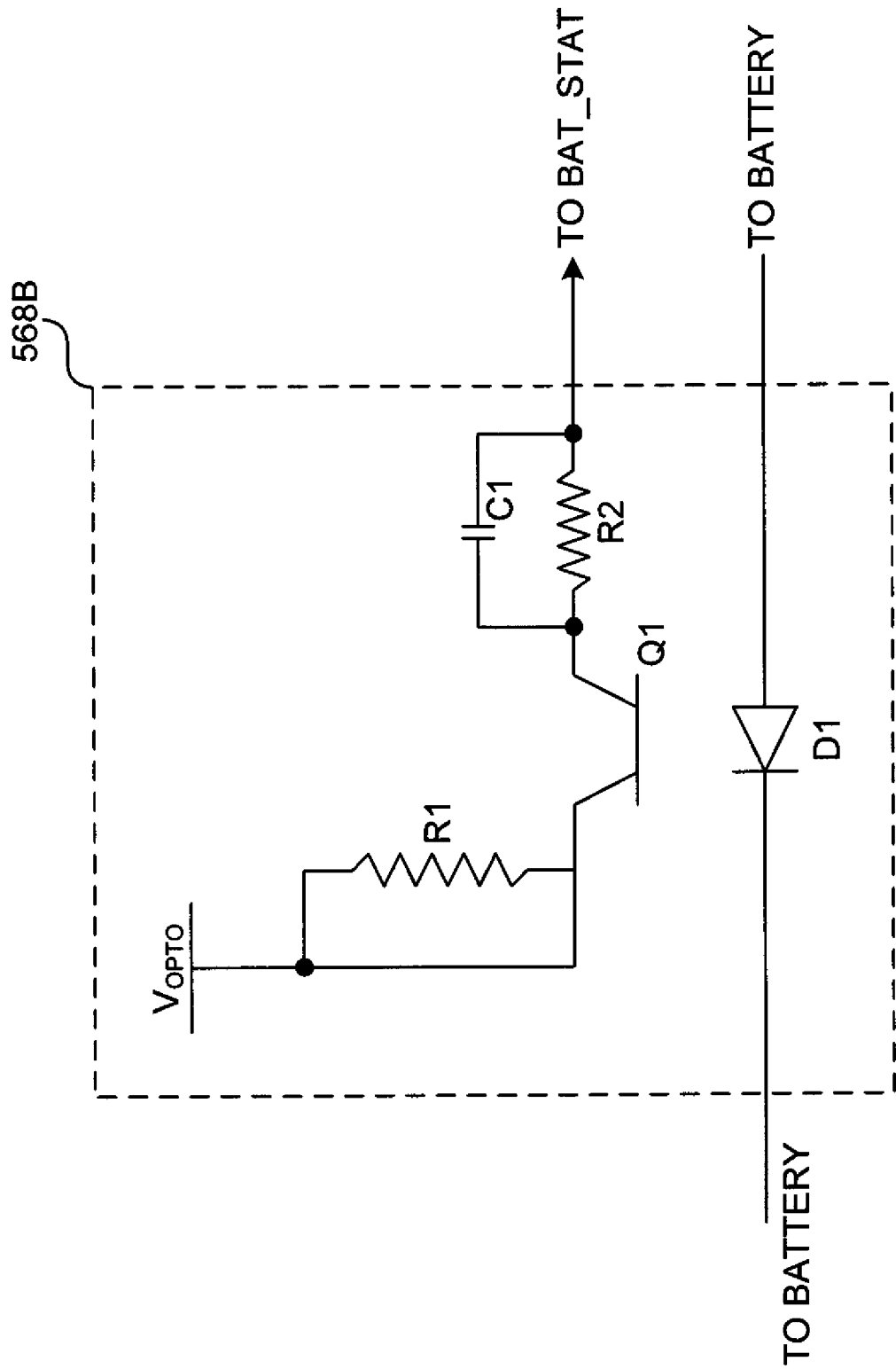

FIG. 5B is a schematic diagram of opto-isolator circuit 568B. Opto-isolator circuit 568B includes diode D1, transistor Q1, resistor R1, resistor R2, and capacitor C2. Opto-isolator circuit 568B may be, for example, employed as embodiments of opto-isolator circuits 468 of FIGS. 4B-4D. However, opto-isolator circuit 568B may also be employed as embodiments of opto-isolator circuits 468 of FIG. 4A.

As shown, resistor R2 and capacitor C1 form a high-pass filter, for example, to pass high-frequency AC noise onto signal BAT_STAT. A power controller may monitor the AC noise on signal BAT_STAT to determine the condition and/or status of the batteries and battery connections. For example, the power controller may integrate (e.g., over one second, one minute, 10 minutes, one day) the power of the AC components from each of the isolators and detect/predict arcing and/or other errors based on differences between the integrated values associated with each opto-isolator circuit. Also, the power controller may monitor DC values of the output voltages for each battery and detect/predict a failed battery and/or jumper based on a difference between its output voltage and the output voltage of other batteries. However, other methods of detecting/predicting battery circuit condition, status, and/or errors are possible.

As one example, resistor R2 and capacitor C1 are selected to provide a roll-off frequency of approximately four to five kilohertz, however, any suitable roll-off frequency may be employed (e.g., depending on sizing of jumpers and/or other wires, connection/coupling type, climate, battery type, etc.). As a specific example, resistor R2 may be a five kilo-ohm potentiometer having a nominal setting of approximately 2.7 kilo-ohms and be adjustable to scale the output of opto-isolator circuit 568. Capacitor C1 may be, for example, a low-leakage 0.05 microfarad polypropylene capacitor. However, any suitable resistors and/or capacitors may be employed as resistor R2 and capacitor C1. Resistor R2 and capacitor C1 may be located at or near the associated battery.

In other opto-isolator circuits, other band-pass filters, high-pass filters, low-pass filters, band-reject filters, and/or the like may be employed. Such filters may include RC filters, LC filters, RLC filters, digital filters, and/or the like.

Diode D1, transistor Q1, resistor R1 operate as discussed above with reference to opto-isolator circuit 568A of FIG. 5A.

Figure 6:
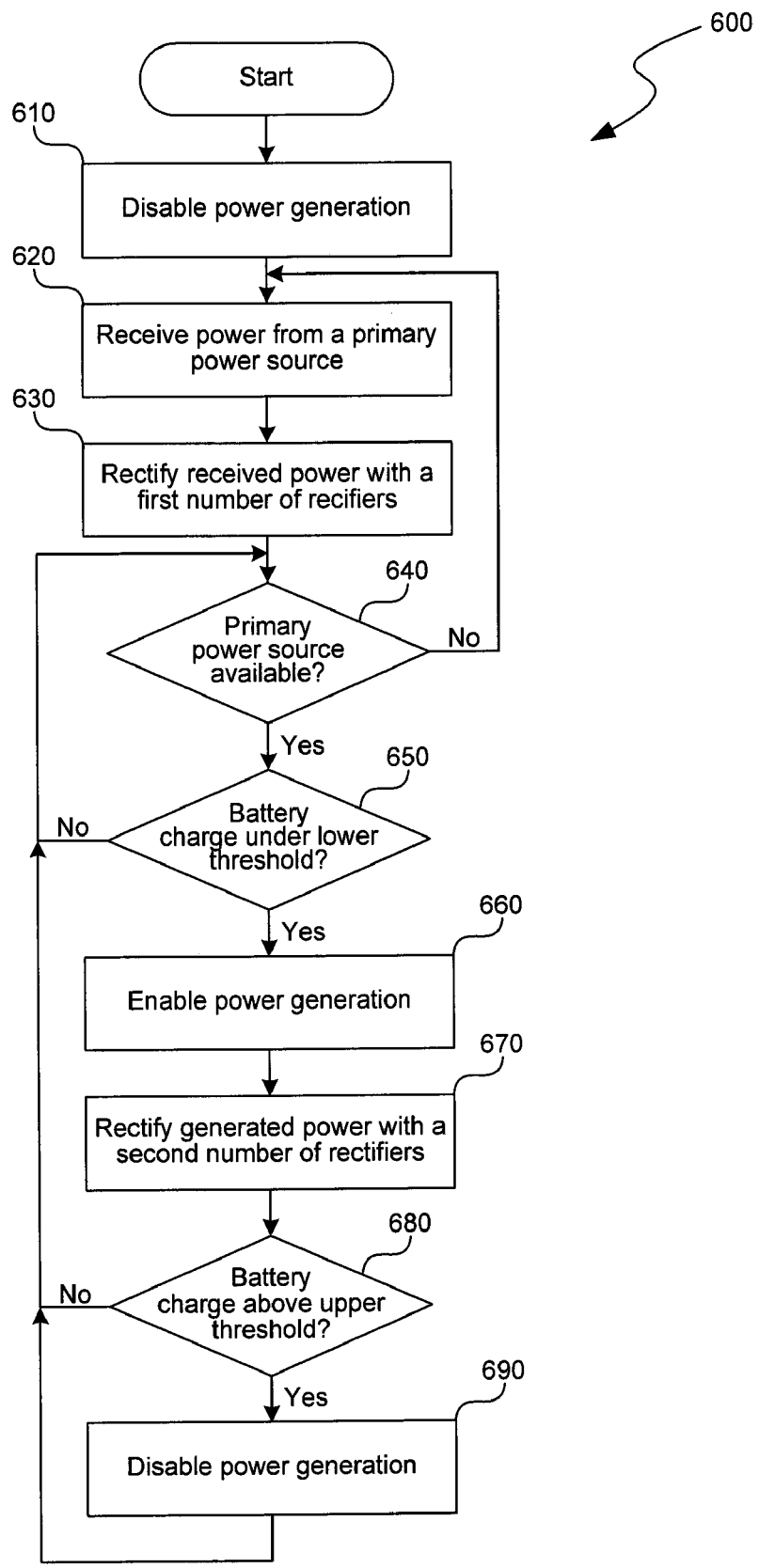
FIG. 6 is a logical flow diagram of a process for conserving power in a wireless communications system in accordance with an embodiment of the invention.

FIG. 6 is a logical flow diagram of process 600 for conserving power in a wireless communications system. For clarity, process 600 is described below as being performed by base station 200 of FIG. 2. However, process 600 may also be performed by processor 314 of FIG. 3 and may be stored in non-volatile memory. Process 600 may also be performed by other processors, by other components, or in other systems, whether or not such processors, components, or systems are described herein.

Flowing from a start block, processing begins at step 610 where power controller 210 disables generator 270. For example, power controller 210 may disable generator 270 to conserve fuel while primary power source AC provides power to primary power interface 280. At step 620, primary power interface 280 receives power from primary power source AC. At step 630, rectifier and switch circuit 230 employs a first number of rectifiers to rectify the received power. For example, to decrease the operating temperature of the operating rectifiers, the first number of rectifiers may include all or almost all of the rectifiers in rectifier and switch circuit 230. In one embodiment, base station 200 may employ the rectified power to power communications interface 280 or to charge battery circuit 260.

At decision block 640, power controller 210 determines whether power from primary power source AC is available. Power controller 210 may perform this determination based on status signal RECT_STAT, based on a status signal from primary power interface 250, and/or the like. If power controller 210 does detect availability of power from primary power source 250, it returns processing to step 620. Otherwise, power controller 210 continues processing at decision block 650.

At decision block 650, power controller 210 determines if the battery charge is under a lower threshold. For example, power controller 210 may estimate battery circuit 260's remaining charge based on the battery circuit 260's output voltage. If this remaining charge is not under the lower threshold, power controller 210 returns processing to decision block 640. Otherwise, power controller 210 continues to step 660.

Power controller 210 enables power generation at step 660, for example, by starting generator 270. After power controller 210 enable power generation, processing flows to step 670 where rectifier and switch circuit 230 employs a second number of rectifiers to rectify the generated power. In one embodiment, the second number of rectifiers is less than the first number of rectifiers such that each of the operating rectifiers operates at a higher load and with higher efficiency. From step 670, processing flows to decision block 680.

At decision block 680, power controller 210 determines if the battery charge is above an upper threshold. For example, power controller 210 may estimate battery circuit 260's remaining charge based on the battery circuit 260's output voltage. If the remaining charge on battery circuit 260 is not above the upper threshold, power controller 210 returns processing to decision block 640. Otherwise, power controller 210 continues processing at step 690 where power controller 210 disables generator 270. From step 690, power controller 210 returns processing to decision block 640.

Suitable Methods of Testing

Figure 7:
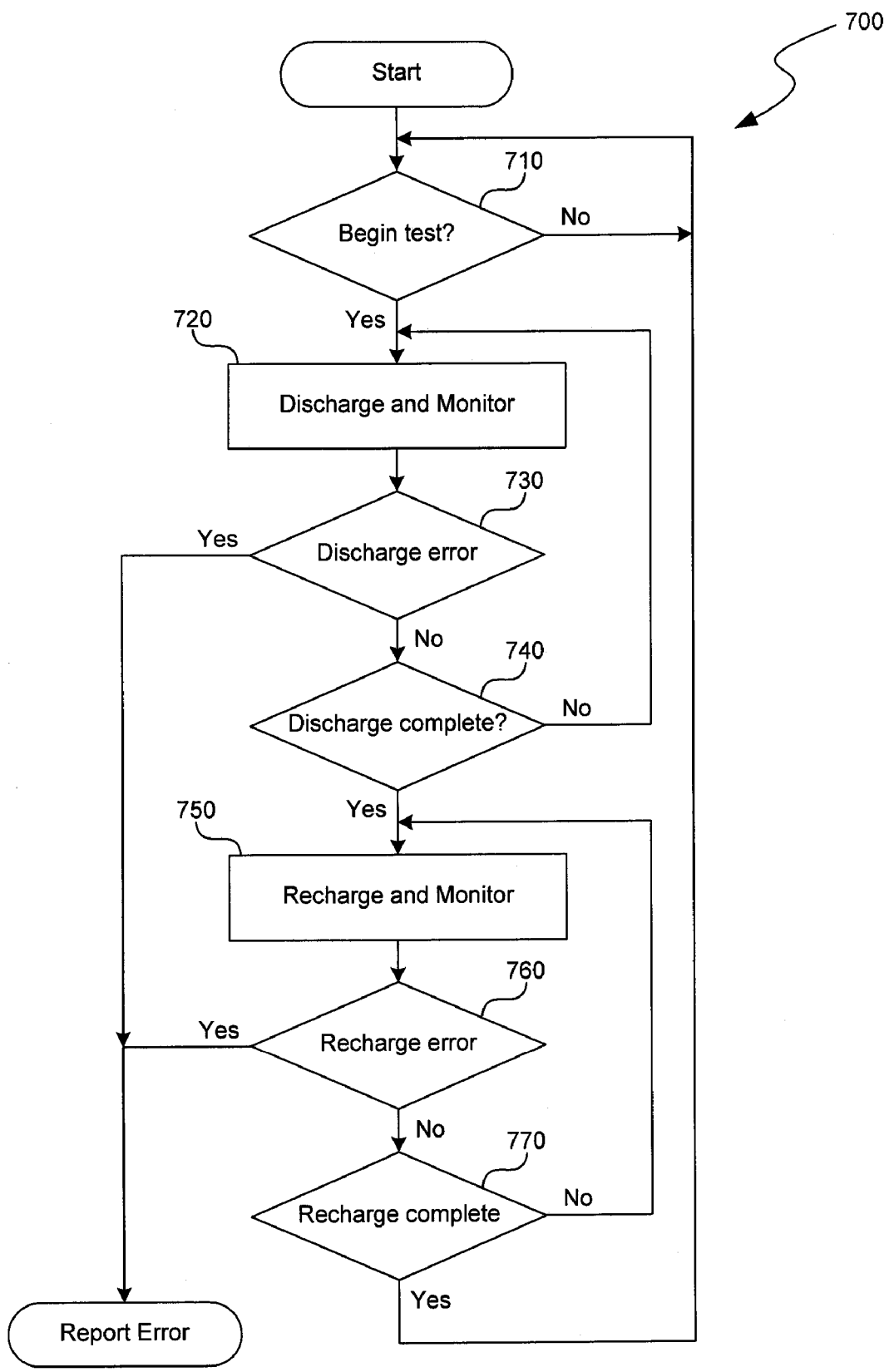
FIG. 7 is a logical flow diagram of a process for testing a battery circuit in accordance with an embodiment of the invention.

FIG. 7 is a logical flow diagram of process 700 for testing a battery circuit. For clarity, process 700 is described below as being performed by base station 200 of FIG. 2. However, process 700 may also be performed by processor 314 of FIG. 3 and may be stored in non-volatile memory. Process 700 may also be performed by other processors, by other components, or in other systems, whether or not such processors, components, or systems are described herein. As with battery circuits 460A-460D of FIGS. 4A-4D and opto-isolator circuits 568A-568B of FIGS. 5A-5B, process 700 may be employed in, or with, any system employing a backup or other battery circuit.

Flowing from a start block, processing begins at decision block 710 where power controller 210 determines whether a battery test should begin. For example, power controller 210 may make this determination according to a user request to initiate a battery test, a periodic testing schedule (e.g., monthly, weekly, annual), nonperiodic testing schedule, random testing function, and/or the like. Processing remains at decision block 710 until power controller 210 determines that a battery test should begin. Processing then flows to step 720.

At step 720, power controller 210 discharges and monitors battery circuit 260. For example, power controller 210 may discharge battery circuit 260, for example, by powering communications interface 280 from battery circuit 260. During step 720, power controller 210 may also monitor the output of opto-isolators 468. For example, power controller 210 may monitor the batteries to determine whether one or more batteries have a different DC values, whether a connection is arcing, whether non common-mode AC noise is present, and/or the like.

From step 720, processing flows to decision block 730 where power controller 210 determines whether a discharge error occurred. For example, power controller 210 may determine that a discharge error occurred if there is a difference of more than five to eight percent between the output voltages of the batteries, if non common-mode AC noise above a given threshold is detected, and/or the like. However, any suitable processes may be employed at decision block 730. If a discharge error is detected, process 700 ends and returns an error message or flag. This error message or flag may also identify faulty batteries and/or connections. Also, this error message or flag may be reported to a remote monitoring facility, e.g., via OMC interface 320, at which the error may be logged, a trouble ticket opened, a technician dispatched, and/or the like. However, if no discharge error is detected, processing flows to decision block 740.

At decision block 740, power controller 210 determines whether the discharge is complete. For example, power controller 210 may determine that discharge is complete based on a time duration (e.g., fifteen or twenty minute discharge time), a percentage of remaining battery power (e.g., 80 percent, 50 percent, or 10 percent remaining), a battery circuit output voltage (e.g., 48, 50, or 52 volts for a 48 volt string having a 54 volt float voltage), and/or the like. If the discharge is complete, processing continues at step 750; otherwise, processing returns to step 720.

At step 750, power controller 210 recharges and monitors battery circuit 260. For example, power controller 210 may be most likely to detect errors as the batteries approach a full charge and their internal resistances decrease. Monitoring may be as described above.

From step 750, processing flows to decision block 760 where power controller 210 determines whether a recharge error occurred. Determination of a recharge error may be similar to the above discussed determination discharge errors. If a recharge error is detected, process 700 ends and returns an error message or flag. This error message or flag may also identify faulty batteries and/or connections. Also, this error message or flag may be reported to a remote monitoring facility, e.g., via OMC interface 320, at which the error may be logged, a trouble ticket opened, a technician dispatched, and/or the like. However, if no recharge error is detected, processing continues at decision block 770.

At decision block 770, power controller 210 determines whether the recharge is complete. For example, power controller 210 may determine that recharge is complete based on a time duration (e.g., fifteen or twenty minute charge time), a percentage of remaining battery power (e.g., 75 percent, 90 percent, or 99 percent remaining), a battery circuit output voltage (e.g., 52 or 53 volts for a 48 volt string having a 54 volt float voltage), a decreasing current draw, and/or the like. If the recharge is complete, processing returns to decision block 710. Otherwise, processing returns to step 750.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the term "connected," "coupled," or any variant thereof means any connection or coupling, either direct or indirect, between two or more elements; the coupling of connection between the elements can be physical, logical, or a combination thereof. Additionally, the words "herein," "above," "below," and words of similar import, when used in this application, shall refer to this application as a whole and not to any particular portions of this application. Where the context permits, words in the above Detailed Description using the singular or plural number may also include the plural or singular number, respectively. The word "or," in reference to a list of two or more items, covers all of the following interpretations of the word: any of the items in the list, all of the items in the list, and any combination of the items in the list.

The above detailed description of embodiments of the system is not intended to be exhaustive or to limit the system to the precise form disclosed above. While specific embodiments of, and examples for, the system are described above for illustrative purposes, various equivalent modifications are possible within the scope of the system, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed in parallel, or may be performed at different times. Further, any specific numbers noted herein are only examples: alternative implementations may employ differing values or ranges.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

I claim:

1. A power system for a cell site of a wireless communications system, the power system comprising:
 a battery circuit, including:
  multiple batteries; multiple jumpers configured to connect two of the batteries in a series configuration, to connect one of the batteries to ground, and to connect another one of the batteries to a battery circuit output;
  multiple sense circuits each configured to monitor at least one of the batteries, wherein each sense circuit includes:
   an opto-isolator circuit coupled across at least one battery and a portion of one jumper, and configured to provide an opto-isolator output to indicate a voltage across the at least one battery and portion of one jumper; and, a high-pass filter configured to pass an alternating current (AC) component of the opto-isolator output to a power controller as a sense circuit output; and, a power controller configured to detect arcing, predict arcing, or both, within the battery circuit, within a ground connection, and within a battery circuit output connection according to integrating a difference in non common-mode components of the AC components of the outputs of each high-pass filter over a time period, and to report detected arcing, predicted arcing, or both, to a remote monitoring facility.

2. The power system of claim 1, wherein each high-pass filter includes an RC filter having a frequency roll off of between approximately four to five kilohertz; wherein each of the multiple batteries is an absorbed glass mat lead-acid battery; wherein the power system is configured to power the wireless communications cell site having a transceiver and associated telecommunications components; wherein the power controller is further configured to detect and/or predict arcing as the multiple batteries transition from discharging to charging or from charging to discharging, to detect a battery circuit error based, at least in part, on a rate of change of the outputs of the high-pass filters, and to detect a battery circuit error based, in part, on a difference between the sense circuit outputs; and, wherein the time period is approximately one minute.

3. The power system of claim 1, wherein the multiple batteries include:
a first battery having at least a positive terminal and a negative terminal;
a second battery having at least a positive terminal and a negative terminal;
a third battery having at least a positive terminal and a negative terminal;
a fourth battery having at least a positive terminal and a negative terminal; wherein the multiple jumpers include:
a first jumper configured to connect the positive terminal of the first battery to ground; and
a second jumper configured to connect the negative terminal of the first battery to the positive terminal of the second battery;
a third jumper configured to connect the negative terminal of the second battery to the positive terminal of the third battery;
a fourth jumper configured to connect the negative terminal of the third battery to the positive terminal of the fourth battery; and,
a fifth jumper configured to connect the negative terminal of the fourth battery to the battery circuit output; and, wherein the multiple sense circuits include:
a first sense circuit coupled across at least a portion of the first jumper;
a second sense circuit coupled across at least the first battery;
a third sense circuit coupled across at least a portion of the second jumper and the second battery;
a fourth sense circuit coupled across at least a portion of the third jumper and the third battery; and,
a fifth sense circuit coupled across at least a portion of the fourth jumper, the fourth battery, and a portion of the fifth jumper.

4. A power monitoring system operable to monitor a battery circuit having multiple batteries, comprising:
multiple sense circuits each configured to monitor voltage across at least one of the batteries and to provide sense circuit outputs to indicate the voltage across the at least one of the batteries; and,
a power controller configured to detect arcing, predict arcing, or both, within the battery circuit according to a difference in non common-mode alternating current (AC) components of the sense circuit outputs.

5. The power monitoring system of claim 4, wherein each sense circuit includes:
an opto-isolator circuit coupled across at least one battery and configured to provide an opto-isolator output to indicate the voltage across the at least one battery; and,
a high-pass filter configured to pass the AC component of the opto-isolator output to the power controller via the sense circuit output.

6. The power monitoring system of claim 4, wherein each sense circuit includes:
an opto-isolator circuit coupled across at least one battery and configured to provide an opto-isolator output to indicate the voltage across the at least one battery; and,
a high-pass filter configured to pass the AC component of the opto-isolator output to the power controller via the sense circuit output, wherein the power controller is further configured to detect a battery circuit error based, in part, on a rate of change of the sense circuit outputs or a difference between the sense circuit outputs.

7. The power monitoring system of claim 4, wherein each sense circuit includes:
an opto-isolator circuit coupled across at least one battery and configured to provide an opto-isolator output to indicate the voltage across the at least one battery; and,
a high-pass filter configured to pass the AC component of the opto-isolator output to the power controller via the sense circuit output, wherein each high-pass filter includes a resistor and a capacitor configured together as a high-pass RC filter.

8. The power monitoring system of claim 4, wherein each sense circuit includes:
an opto-isolator circuit coupled across at least one battery and a portion of one jumper and configured to provide an opto-isolator output to indicate the voltage across the at least one battery; and,
a high-pass filter configured to pass the AC component of the opto-isolator output to the power controller via the sense circuit output, wherein each high-pass filter includes a resistor and a capacitor configured together as a high-pass RC filter having a frequency roll off of between approximately four to five kilohertz.

9. The power monitoring system of claim 4, further comprising other sense circuits configured to monitor a ground connection and an output connection of the battery circuit.

10. The power monitoring system of claim 4, wherein the power controller is configured to detect arcing, predict arcing, or both, as the battery circuit transitions from discharging to charging or from charging to discharging, and to report detected arcing, predicted arcing, or both, to a remote monitoring facility.

11. The power monitoring system of claim 4, wherein the battery circuit is configured to power a wireless communications cell site having a transceiver and associated telecommunications components.

12. The power monitoring system of claim 4, wherein the power controller is further configured to detect arcing, predict arcing, or both, within the battery circuit, within a ground connection of the battery circuit, and within an output connection of the battery circuit according to integrating a difference in non common-mode components of the sense circuit outputs over a time period.

13. The power monitoring system of claim 4, further comprising:
the multiple batteries, wherein each of the multiple batteries is an absorbed glass mat lead-acid battery.

14. The power monitoring system of claim 4, further comprising:
the battery circuit including:
a first battery having at least a positive terminal and a negative terminal;
a second battery having at least a positive terminal and a negative terminal; and,
a first jumper configured to connect the negative terminal of the first battery to the positive terminal of the second battery such that the first battery and the second battery are configured in a series configuration.

15. The power monitoring system of claim 4, further comprising: the battery circuit including:
a first battery having at least a positive terminal and a negative terminal;
a second battery having at least a positive terminal and a negative terminal;
a third battery having at least a positive terminal and a negative terminal;
a fourth battery having at least a positive terminal and a negative terminal;
a first jumper configured to connect the positive terminal of the first battery to ground;
a second jumper configured to connect the negative terminal of the first battery to the positive terminal of the second battery;
a third jumper configured to connect the negative terminal of the second battery to the positive terminal of the third battery;
a fourth jumper configured to connect the negative terminal of the third battery to the positive terminal of the fourth battery; and,
a fifth jumper configured to connect the negative terminal of the fourth battery to the battery circuit output; and
wherein the multiple sense circuits include:
a first sense circuit coupled across at least a portion of the first jumper;
a second sense circuit coupled across at least the first battery;
a third sense circuit coupled across at least a portion of the second jumper and the second battery;
a fourth sense circuit coupled across at least a portion of the third jumper and the third battery; and,
a fifth sense circuit coupled across at least a portion of the fourth jumper, the fourth battery, and a portion of the fifth jumper.

16. A power monitoring system operable to monitor a battery circuit having multiple batteries, comprising:
means for monitoring voltages of at least each of the batteries and to provide indications of the voltages of at least each of the batteries; and,
means for detecting and/or predicting arcing within the battery circuit according to differences in non common-mode alternating current (AC) components of the indications, wherein the means for detecting and/or predicting is coupled to the means for monitoring voltages.

17. The power monitoring system of claim 16, further comprising:
means for monitoring a ground connection and an output connection of the battery circuit.

18. The power monitoring system of claim 16, wherein the means for detecting and/or predicting further comprises means for detecting and/or predicting arcing within the battery circuit, within a ground connection of the battery circuit, and within an output connection of the battery circuit according to integrating the indications over a time period.

19. A method of monitoring a battery circuit, having multiple batteries, of a cell site of a wireless communications system, comprising:
periodically testing the battery circuit by:
discharging the battery circuit;
monitoring for a discharge error;
recharging the battery circuit;
monitoring for a recharging error, wherein the monitoring for the discharge error and the monitoring for the recharge error each includes detecting arcing, predicting arcing, or both, within the battery circuit, within a ground connection, and within a battery circuit output connection according to integrating a difference in non common-mode components of the AC components of the voltages across each of the batteries of the battery circuit over a time period.

20. The method of claim 19, further comprising:
reporting detecting arcing, predicting arcing, or both, to a remote monitoring facility.

* * * * *